United States Patent
Kim et al.

(10) Patent No.: US 9,984,099 B2
(45) Date of Patent: May 29, 2018

(54) SYSTEM AND METHOD USING AFFORDANCE FEATURE REPOSITORY

(71) Applicant: RESEARCH & BUSINESS FOUNDATION SUNGKYUNKWAN UNIVERSITY, Suwon-si (KR)

(72) Inventors: Yong Se Kim, Seoul (KR); Sun Ran Kim, Seoul (KR); Ji Hye Noh, Seoul (KR); Yeon Koo Hong, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 490 days.

(21) Appl. No.: 14/424,906

(22) PCT Filed: Aug. 12, 2013

(86) PCT No.: PCT/KR2013/007255
§ 371 (c)(1),
(2) Date: Jul. 22, 2015

(87) PCT Pub. No.: WO2014/035079
PCT Pub. Date: Mar. 6, 2014

(65) Prior Publication Data
US 2015/0324393 A1 Nov. 12, 2015

(30) Foreign Application Priority Data

Aug. 30, 2012 (KR) ........................ 10-2012-0095935

(51) Int. Cl.
*G06F 7/00* (2006.01)
*G06F 17/30* (2006.01)
(Continued)

(52) U.S. Cl.
CPC .. *G06F 17/30268* (2013.01); *G06F 17/30424* (2013.01); *G06F 17/30604* (2013.01); *G06F 17/50* (2013.01); *G06N 5/04* (2013.01)

(58) Field of Classification Search
CPC ......... G06F 17/30604; G06F 17/30268; G06F 17/30424; G06F 17/5063; G06F 17/5036; G06N 5/04
See application file for complete search history.

(56) References Cited

U.S. PATENT DOCUMENTS 6,614,454 B1 * 9/2003 Livingston ............ G06F 3/1205
715/201
7,239,316 B1 * 7/2007 Cox ...................... G06T 11/206
345/440
(Continued)

FOREIGN PATENT DOCUMENTS

JP 2009-093639 A 4/2009
JP 2010-146099 A 7/2010
(Continued)

OTHER PUBLICATIONS

International Search Report dated Nov. 20, 2013 in International Application No. PCT/KR2013/007255.

*Primary Examiner* — Daniel Kuddus
(74) *Attorney, Agent, or Firm* — NSIP Law

(57) ABSTRACT

A design system using affordance features, the design system is provided. The system includes a storage unit that stores multiple affordances, that is messages that induce natural and efficient corresponding activities of human; a search unit that searches affordance features, that is, the structural entities that provide corresponding affordances, to search conditions set by a user; an output unit that outputs design information corresponding to the affordance features searched by the search unit and design information corresponding to an affordance feature selected by the user on a (Continued)

user interface; and an analogical reasoning unit that performs analogical reasoning on the basis of the design information corresponding to the selected affordance feature and derives a new affordance feature for a predetermined design target to be designed by the user.

13 Claims, 9 Drawing Sheets

(51) Int. Cl.
*G06N 5/04* (2006.01)
*G06F 17/50* (2006.01)

(56) References Cited

U.S. PATENT DOCUMENTS

| | | | | |
|---|---|---|---|---|
| 8,190,627 | B2* | 5/2012 | Platt | G06F 17/30389 707/767 |
| 8,260,809 | B2* | 9/2012 | Platt | G06F 17/276 707/771 |
| 8,843,959 | B2* | 9/2014 | McMaster | H04N 7/17318 382/103 |
| 8,997,009 | B2* | 3/2015 | Bechtel | G06F 3/016 463/37 |
| 9,202,254 | B2* | 12/2015 | Rodriguez | H04W 4/001 |
| 9,449,280 | B2* | 9/2016 | Rubin | G06N 7/02 |
| 9,489,081 | B2* | 11/2016 | Anzures | H04L 51/10 |
| 2002/0169771 | A1* | 11/2002 | Melmon | G06F 17/30011 |
| 2004/0148578 | A1* | 7/2004 | McConaghy | G06F 17/5036 716/102 |
| 2009/0006343 | A1* | 1/2009 | Platt | G06F 17/30389 |
| 2009/0187425 | A1* | 7/2009 | Thompson | G06F 19/3443 705/3 |
| 2011/0087704 | A1* | 4/2011 | Bishop | G06F 17/30011 707/797 |
| 2011/0243458 | A1* | 10/2011 | Yoshioka | G06T 1/0021 382/209 |
| 2012/0239653 | A1* | 9/2012 | Platt | G06F 17/30389 707/737 |
| 2013/0046719 | A1* | 2/2013 | Sogo | G06Q 10/10 706/46 |
| 2013/0103680 | A1* | 4/2013 | Arrasvuori | G06F 17/301 707/728 |
| 2013/0282429 | A1 | 10/2013 | Kim et al. | |

FOREIGN PATENT DOCUMENTS

| | | |
|---|---|---|
| JP | 2010-146276 A | 7/2010 |
| KR | 10-2008-0104397 A | 12/2008 |
| KR | 10-2010-0113382 A | 10/2010 |
| KR | 10-2012-0065819 A | 6/2012 |
| KR | 10-1339800 B1 | 12/2013 |

* cited by examiner

FIG. 1

| Sub-Function \ Sub-Task | | T1 Look for the tumbler | T2 Pick up the tumbler | T3 Hold cover | T4 Open cover | T5 Put tumbler's cover on the place | T6 Pour liquid into the tumbler | T7 Check the height of liquid | T8 Closd cover | T9 Close opening | T10 Pick up the tumbler filled with liquid | T11 Put tumbler into bag | T12 Bring up tumbler | T13 Grasp tumbler to drink | T14 Open opening | T15 Drink liquid | T16 Put the tumbler on th place | T17 Open cover | T18 Put on the cover | T19 Grasp the tumbler | T20 Pour water into the tumbler for washing | T21 Wash the tumbler | T22 Dry the tumbler |
|---|---|---|---|---|---|---|---|---|---|---|---|---|---|---|---|---|---|---|---|---|---|---|---|
| | | | Pre | | | | | | | | | | During | | | | | | Post | | | | |
| F1 | Stand on a surface | | | | | ♦ | | | | | | | | | | | ♦ | | | | | | |
| F2 | Import humanhands | | ♦ | ♦ | ♦ | | | | ♦ | ♦ | ♦ | ♦ | ♦ | ♦ | | ♦ | | ♦ | ♦ | ♦ | ♦ | ♦ | ♦ |
| F3 | Guide humanhands | | ♦ | ♦ | | | | | | | | | | ♦ | | | | | | | | | |
| F4 | Seperate cover and body | | | | ♦ | | | | | | | | | | | | | | | | | | |
| F5 | Import liquid | | | | | | ♦ | | | | | | | | | | | | | | ♦ | | |
| F6 | Store liquid | | | | | | ♦ | | | | | | | | | | | | | | ♦ | | |
| F7 | Combine cover and body | | | | | | | | ♦ | ♦ | | | | | | | | | ♦ | | | | |
| F8 | Insulate heat | | | | | | ♦ | | ♦ | ♦ | | | | | | | | | | | | | |
| F9 | Export liquid | | | | | | | | | | | | | | | ♦ | | | | | | | |
| F10 | Export humanhands | | | | | ♦ | | | | | | | | | | | ♦ | | | | | | ♦ |

Annotations: Finger grasp-ability, Hand grasp-ability, Separate-ability, Store-ability, Pour-ability, Place-ability, Hand position-ability, Align-ability, Heat prevent-ability, Place-ability

FIG. 7

9 affordances

Align-ability

Finger grasp-ability

Hand grasp-ability

Hand position-ability

Pour-ability

Store-ability

Place-ability

Heat prevent-ability

Separate-ability

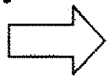

| AFFORDANCE STORAGE LIST | | |
|---|---|---|
| no | Affordance | Total:213 |
| 1 | ACCESS-ABILITY | 6 |
| 2 | ALIGN-ABILITY | 4 |
| 3 | BACK LEAN-ABILITY | 4 |
| 4 | CONNECT-ABILITY | 4 |
| 5 | DIRECTION CONTROL-ABILITY | 5 |
| 6 | FINGER GRASP-ABILITY | 13 |
| 7 | FINGER PRESS-ABILITY | 4 |
| 8 | FINGER PUSH & PULL-ABILITY | 6 |
| 9 | FOLD-ABILITY | 6 |
| 10 | HAND GRASP-ABILITY | 26 |
| 11 | HAND POSITION-ABILITY | 5 |
| 12 | IDENTIFY-ABILITY | 6 |
| 13 | INFO. RECOGNIZE-ABILITY | 11 |
| 14 | INFO. RETRIEVE-ABILITY | 7 |
| 15 | INSERT-ABILITY | 18 |
| 16 | LEAVE-ABILITY | 6 |
| 17 | MAINTAIN-ABILITY | 5 |
| 18 | MOVE-ABILITY | 6 |
| 19 | POUR-ABILITY | 5 |
| 20 | PROVIDE-ABILITY | 4 |
| 21 | PULL OUT-ABILITY | 4 |
| 22 | RECEIVE-ABILITY | 6 |
| 23 | ROTATE-ABILITY | 5 |
| 24 | SCRAPE-ABILITY | 5 |
| 25 | SEE THROUGH-ABILITY | 9 |
| 26 | STACK-ABILITY | 6 |
| 27 | STORE-ABILITY | 6 |
| 28 | SUPPORT-ABILITY | 11 |
| 29 | TAKE-ABILITY | 4 |
| 30 | WATER REMOVE-ABILITY | 6 |

SYSTEM AND METHOD USING AFFORDANCE FEATURE REPOSITORY

CROSS REFERENCE TO RELATED APPLICATIONS

This application is a National Stage of International Application No. PCT/KR2013/007255 filed Aug. 12, 2013, claiming priority based on Korean Patent Application No. 10-2012-0095935 filed Aug. 30, 2012, the contents of all of which are incorporated herein by reference in their entirety.

TECHNICAL FIELD

The embodiments described herein pertain generally to a design system and a method using an affordance feature repository.

BACKGROUND

Conventionally, it has been known that the concept of affordance is effective in reflecting a user's need and demand. However, conventionally, such a fact has been recognized conceptually. Therefore, any specific affordance design system for improving a design of a product or a service has not been developed.

Although product development companies and service companies have recognized a need to analyze a user's activities in using a product and a service, a design for improving efficiency in interaction has not been derived due to the lack of activity analysis technology.

In this regard, Korean Patent Laid-open Publication No. 2012-0065819 (entitled "Digital forensic apparatus for analyzing the user activities and method thereof") discloses a digital forensic apparatus for analyzing user activities, comprising: a collection unit that collects analysis information relevant to the user activities from a target device in need of user activity analysis; and an analysis unit that analyzes the analysis information collected by the collection unit, understands user activity information for each analysis information, and aligns and displays the activity information in chronological order.

Further, Korean Patent Laid-open Publication No. 2010-0113382 (entitled "Learning method for probabilistic affordance models and behavior selection method for a robot using the probabilistic affordance models") discloses a technology in which a structure relevant to the correlations between a robot and an environment is configured using a Bayesian network for each affordance, learning data for each affordance are collected from the robot, and a probabilistic model relevant to the affordance on the basis of the Bayesian network is individually created using the learning data.

DISCLOSURE OF THE INVENTION

Problems to be Solved by the Invention

In view of the foregoing problems, some example embodiments provide a design system using an affordance feature repository which facilitates planning of a product design by searching affordances of a product stored in a repository and affordance features extracted on the basis of the affordances according to search conditions.

Means for Solving the Problems

In a first example embodiment, A design system using an affordance feature, the design system including a storage unit that stores multiple affordances, one or more affordance features matched with each of the affordances, and design information corresponding to each of the affordance features; a search unit that searches affordance features corresponding to search conditions set by a user; an output unit that outputs design information corresponding to the affordance features searched by the search unit and design information corresponding to an affordance feature selected by the user on a user interface; and an analogical reasoning unit that supports or performs analogical reasoning on the basis of the design information corresponding to the selected affordance feature and derives a new affordance feature for a predetermined design target to be designed by the user, wherein the affordance features are extracted on the basis of the affordances, and the affordances are identified on the basis of correlations between multiple functions and activities for a pre-analyzed design target.

In a second example embodiment, A design method using an affordance feature, the design method including storing multiple affordances, one or more affordance features matched with each of the affordances, and design information corresponding to each of the affordance features; searching affordance features corresponding to search conditions set by a user; performing analogical reasoning on the basis of design information corresponding to an affordance feature selected by the user from design information corresponding to the searched affordance features; and deriving a new affordance feature for a predetermined design target to be designed by the user, wherein the affordance features are extracted on the basis of the affordances, and the affordances are identified on the basis of correlations between multiple functions and activities for a pre-analyzed design target.

Effect of the Invention

In accordance with the example embodiments, it is possible to reduce a cognitive load in using functions of a product which has been increased in complexity. Further, it is possible to improve user satisfaction in design by inducing a user to do a natural and appropriate use activity with respect to the product.

Furthermore, the example embodiments can improve user convenience at the time of designing a product and can be provided as a guideline for planning of a product design in the future.

BRIEF DESCRIPTION OF THE DRAWINGS

FIG. 1 is a diagram showing an example in which affordances are identified in consideration of interactions between functions of a product and activities of a user.

FIG. 7 is a diagram showing an example of updating the affordance extracted from the product in an affordance storage list.

MODE FOR CARRYING OUT THE INVENTION

Figure 2:
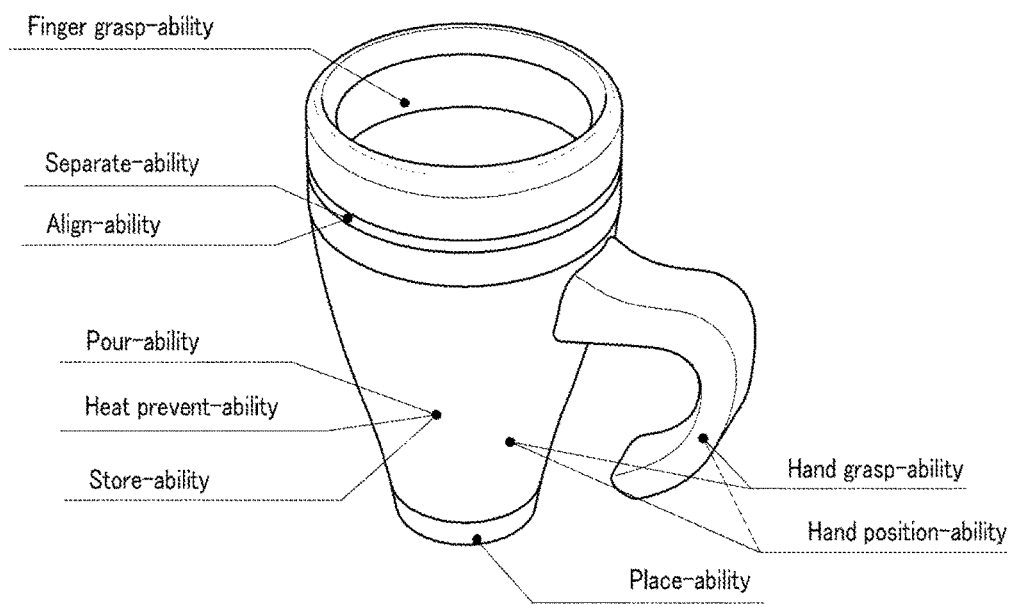
FIG. 2 is a diagram showing an example of affordance features extracted from the product.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

An affordance design using an affordance feature repository suggested herein may mean a system for deriving a new design by (1) deriving affordances for a design target, (2) searching the derived affordances from the affordance feature repository, and (3) deriving a new design by referring to another design having the same affordances in the repository.

FIG. 1 is a diagram showing an example in which affordances are identified in consideration of interactions between functions of a product and activities of a user, and FIG. 2 is a diagram showing an example of affordance features extracted from the product.

An affordance may be extracted using a Function-Task Interaction (FTI) method in order to identify the affordance. At this time, it is necessary to consider physical interaction and a cognitive interaction separately or simultaneously in order to identify the affordance. If the affordance is identified by the FTI, an affordance feature can be extracted on the basis of the identified affordance. Then, a user can design a product in consideration of the extracted affordance and affordance feature.

In FIG. 1, a tumbler is exemplified, and functions of the tumbler are illustrated along a vertical axis and user activities of using the tumbler are illustrated along a horizontal axis. By way of example, F9 as one of the functions of the tumbler represents a function of exporting a liquid (Export liquid), and as activities interacting with F9, an activity T15 of drinking the liquid (Drink liquid) and an activity T22 of drying the tumbler (Dry the tumbler) are illustrated. Therefore, it is possible to identify an affordance to pour water (Pour-ability) on the basis of the interactions between F9 and T15 and T22. In the example as shown in FIG. 1, a total of 9 affordances are identified on the basis of the interactions between the functions and the activities in the same manner as described above.

The affordance features corresponding to the affordances identified as such are illustrated in FIG. 2. Referring to FIG. 2, the total of 9 affordance features for the tumbler including an affordance feature to grasp the tumbler with fingers (Finger grasp-ability feature), an affordance feature to separate the product (Separate-ability feature), an affordance feature to align the product (Align-ability feature), an affordance feature to prevent heat (Heat Prevent-ability feature), an affordance feature to store the liquid (Store-ability feature), an affordance feature to place the product (Place-ability feature), an affordance feature to grasp the tumbler with a hand (Hand grasp-ability feature), and an affordance feature to place the hand (Hand position-ability feature) in addition to the affordance to pour water are identified by the user. However, the affordance features identified as described above are only examples, and various affordance features for the same design target (or product) can be identified depending on the design.

Figure 3:
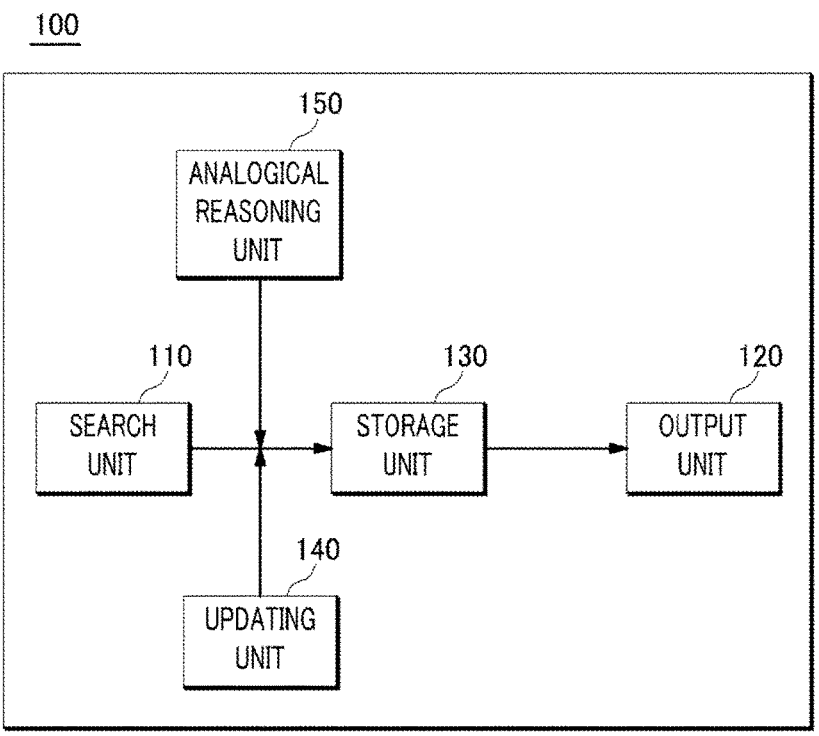
FIG. 3 is a block diagram of a design system using an affordance feature repository in accordance with an example embodiment.

FIG. 3 is a block diagram of a design system 100 using an affordance feature repository in accordance with an example embodiment.

The design system 100 using an affordance feature repository in accordance with the example embodiment may include a search unit 110, an output unit 120, a storage unit 130, an updating unit 140, and an analogical reasoning unit 150.

For reference, each of components illustrated in FIG. 3 in accordance with the example embodiment of the present disclosure may imply software or hardware such as a field programmable gate array (FPGA) or an application specific integrated circuit (ASIC), and they carry out a predetermined function.

However, the components are not limited to the software or the hardware, and each of the components may be stored in an addressable storage medium or may be configured to implement one or more processors.

Accordingly, the components may include, for example, software, object-oriented software, classes, tasks, processes, functions, attributes, procedures, sub-routines, segments of program codes, drivers, firmware, micro codes, circuits, data, database, data structures, tables, arrays, variables and the like.

The components and functions thereof can be combined with each other or can be divided.

The search unit 110 is configured to search affordance features corresponding to search conditions set by the user. At this time, the search unit 110 may search an affordance feature on the basis of a predetermined design target to be designed by the user and an image and a structural description of the affordance feature. Further, the search unit 110 may search an affordance feature by way of keyword search. The search unit 110 will be described with reference to FIG. 4 to FIG. 5.

Figure 4:
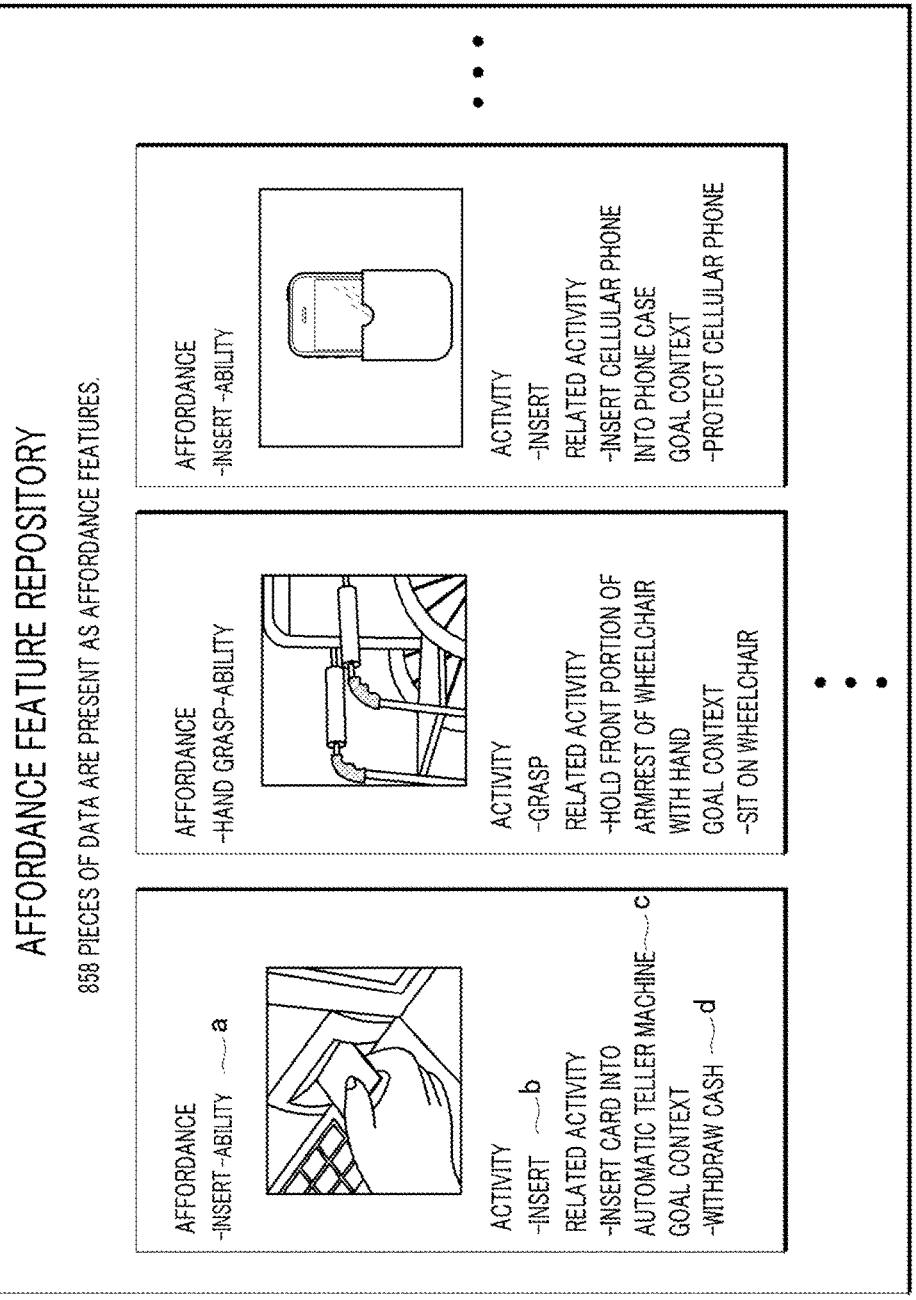
FIG. 4 and FIG. 5 are diagrams each showing an example of a search result searched by a search unit.
Figure 5:
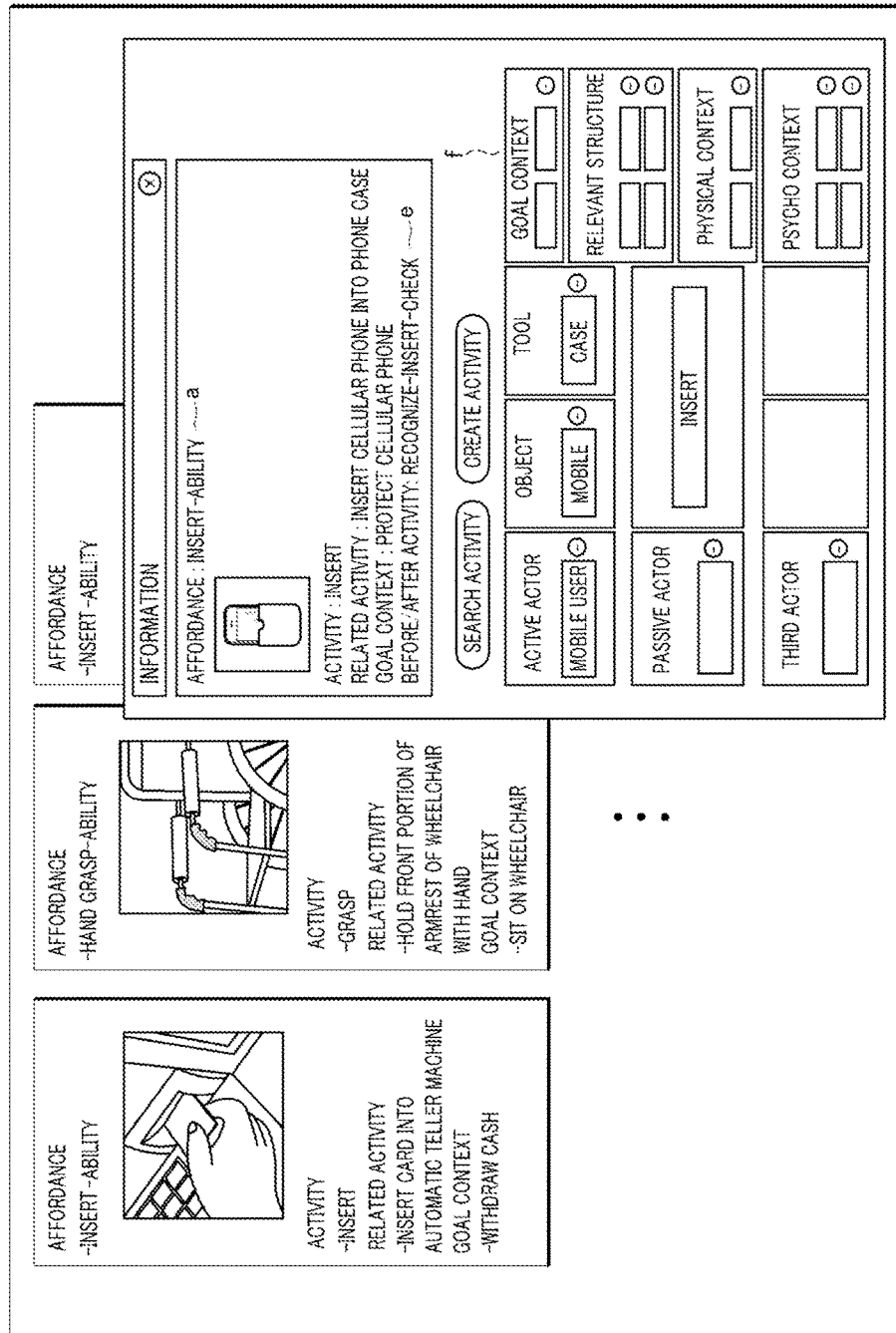

FIG. 4 and FIG. 5 are diagrams each showing an example of a search result searched by the search unit 110.

FIG. 4 shows a case where search conditions set by the user are images and structural descriptions of affordance features. By way of example, if a search for an image of an affordance to grasp with a hand is carried out, an image showing that an electric driver is grasped with a hand is searched and a structural description corresponding thereto is also suggested. Therefore, as affordance features of the searched product, features of a grip of a game console controller, a handle of a carriage, a holder of a kettle, and a grip of a power saw are searched. The user may select some affordance features for the predetermined design target (product) to be designed by the user from the searched affordance features and use the selected affordance features.

To be specific, referring to FIG. 4, various information may be output, and the various information may include names a of respective affordances, descriptions of the affordances, induced activities b, activities c related to the induced activities, and goal contexts d. By way of example, if a name of an affordance is "insert-ability", a description thereof may be "induce an insertion activity", an induced activity may be "insert", an activity related thereto may be "insert a card into an automatic teller machine", and a goal context may be "withdraw cash". In addition, although not illustrated, the present system may provide functions of enlarging an image, checking specific information of an affordance feature, storing the image, and storing a frequently used affordance feature similar to a bookmark.

FIG. 5 shows a case where a search condition set by the user is a keyword search function. By way of example, if a search is carried out with a keyword "grasp with a hand", images of multiple activities related to "grasp with a hand" are illustrated together with brief descriptions thereof. If a certain image is selected from the searched images, affordances corresponding thereto and a description of the image are suggested. Thus, the user may consider the suggestions at the time of designing a product in the future.

To be specific, referring to FIG. 5, various information may be output, and the various information may include names a of respective affordances, activities e before/after induced activities, and context-based activity model information of the corresponding activities. By way of example, if a name of an affordance is "insert-ability", an activity related thereto may be "insert a cellular phone into a phone case", a goal context may be "protect the cellular phone", and activities before/after the activity may be "recognize" and "check". As compared with FIG. 4, it can be seen that a new pop-up window g is created and displays more detailed information. In addition, although not illustrated, the present system may provide functions of searching and creating a new activity.

Herein, the concept of context-based activity model information may be referred to U.S. patent application Ser. No. 13/773,897 or Korean Patent Application No. 10-2012-018988. By way of example, an activity may include a goal of an activity subject, and the activity subject may include an active actor, a passive actor, and a third party actor. An object as a target of the activity may include a function, a behavior, and a structure, and a tool as a means for achieving the goal may include a function, a behavior, and a structure. Further, various activity experiences may be created depending on each component of a physical context, a psychological context, etc. FIG. 5 illustrates an example of an interface through which context-based activity model information can be input/corrected/displayed.

The search unit 110 may provide various search functions to the user. Since images of the search result are provided together with descriptions corresponding thereto, it may be helpful for the user to select an affordance feature to be considered at the time of designing a product in the future.

Referring to FIG. 3 again, the output unit 120 may output design information corresponding to the affordance features searched by the search unit 110 and design information corresponding to the affordance features selected by the user on a user interface. At this time, the design information may include at least one of design constraints corresponding to the respective affordance features and the above-described context-based activity model information, and the design constraints may vary depending on a system type, a fit, a technical field, or a function to be used.

Figure 6:
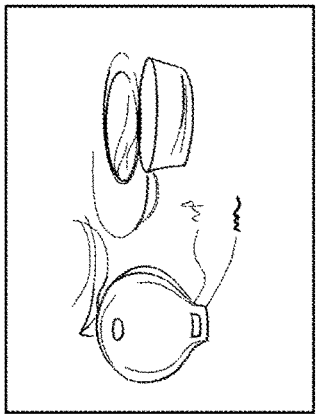
FIG. 6 is a diagram showing an output of a searched affordance feature and design information corresponding thereto.

The output unit 120 will be described hereinafter with reference to FIG. 6. FIG. 6 is a diagram showing an output of a searched affordance feature and design information corresponding thereto.

If the user selects any one affordance feature from the affordance features searched by the search unit 110, the output unit 120 outputs an image and a design constraint corresponding to the selected affordance feature among various design information on the user interface. At this time, the user may select a specific affordance feature according to an analogy with a target to be designed. FIG. 6 is a diagram showing that the output unit 120 outputs a result of selecting an image of an activity of pouring water while holding a holder of a kettle among the searched affordance features as shown in FIG. 5 and a design constraint corresponding thereto.

There may be 8 design constraints DC1 to DC8 of the product with respect to the affordance feature corresponding to the affordance to pour water. At this time, on the basis of analogical reasoning between the searched affordance feature and a predetermined design target (product) to be designed, the user may correct the design constraints of the product to be designed. The analogical reasoning may be conducted by an analogical reasoning unit 150 to be described later.

By way of example, a kettle has a design constraint to have an opening smaller than a cup (DC3: opening is smaller than a cup), a tumbler does not need to have an opening smaller than a cup. Thus, the user may correct a design constraint to have an opening smaller than a mouth of the user (DC3: opening is smaller than a mouth). Further, the kettle needs to have a design constraint to be tilted toward a cup direction while holding a holder (DC5: tilt toward cup direction while holding the handle), but as for the tumbler, the design constraint may be corrected to be tilted toward a user direction while holding a body or a grip of the tumbler (DC5: tilt toward user direction while holding the body or handle).

Since the output unit 120 outputs various design information (images corresponding to the searched affordance features and design constraints corresponding thereto) searched by the search unit 110 on the user interface, the user may correct a part of the design constraints with respect to the searched affordance features and thus reflect them and easily make a design at the time of designing a product in the future.

Referring to FIG. 3 again, the storage unit 130 may store multiple affordances, one or more affordance features matched with each of the affordances, and design information corresponding to each of the affordance features. At this time, the storage unit 130 may store affordance features of a product newly designed by the updating unit 140 to be described below and design information corresponding thereto. Further, the storage unit 130 may store new affordance features derived according to analogical reasoning of the analogical reasoning unit 150 to be described later and design information corresponding thereto.

Meanwhile, the storage unit 130 may be implemented by at least one of storage media including, but not limited to, non-volatile memory devices such as cache, ROM (read only memory), PROM (programmable ROM), EPROM (erasable programmable ROM), EEPROM (electrically erasable programmable ROM), flash memory, volatile memory devices such as RAM (random access memory), or hard disk drive or CD-ROM.

The updating unit 140 may update the affordance feature selected by the user from the affordance features searched by the search unit 110. That is, the affordance feature selected by the user from the affordance features searched by the search unit 110 can be used at the time of designing a product by correcting a design constraint. As such, the affordance feature of the designed product may be updated by the updating unit 140 and stored in the storage unit 130. Therefore, if the user wants to design another product in the future, the user can search the updated affordance feature. Thus, as the design system 100 using an affordance feature repository in accordance with the example embodiment is continuously used, updated data are accumulated. Therefore, in the future, a group may be formed according to a project, a product, and a concept for each user and a history of the used affordance feature repository may be established.

Further, the updating unit 140 may update the affordance as well as the affordance feature stored in the storage unit 130. This will be described hereinafter with reference to FIG. 7.

FIG. 7 is a diagram showing an example of updating the affordance extracted from the product in an affordance storage list.

If the user identifies multiple affordances according on the basis of Function-Task Interaction (FTI) in order to design a product, the identified affordances may be stored in the storage unit 130 through the updating unit 140. FIG. 7 illustrates 9 affordances for a tumbler as a result of identification. In this case, the user can update only some affordances of the identified affordances for the product, and in the present example, 6 affordances are updated by the updating unit 140 and 3 affordances are not updated. The updated affordances are stored in a pre-stored affordance storage list, and the search unit 110 may search affordance features on the basis of the updated affordances.

Further, the analogical reasoning unit 150 may perform analogical reasoning on the basis of design information corresponding to the affordance feature selected by the user and derive a new affordance feature for a predetermined design target to be designed by the user. Note that this could be done by human designers typically while in the future this could be done by an autonomous agent. At this time, the new affordance feature may not be pre-stored in the storage unit 130, and the analogical reasoning may refer to a process of finding morphological, relational, structural analogies between targets. Further, the analogical reasoning unit 150 may be operated in cooperation with the storage unit 130, and the newly derived affordance feature may be appropriately combined with information previously stored in the storage unit 130. Design information corresponding to the new affordance feature may be derived and created in the analogical reasoning unit 150.

Figure 8:
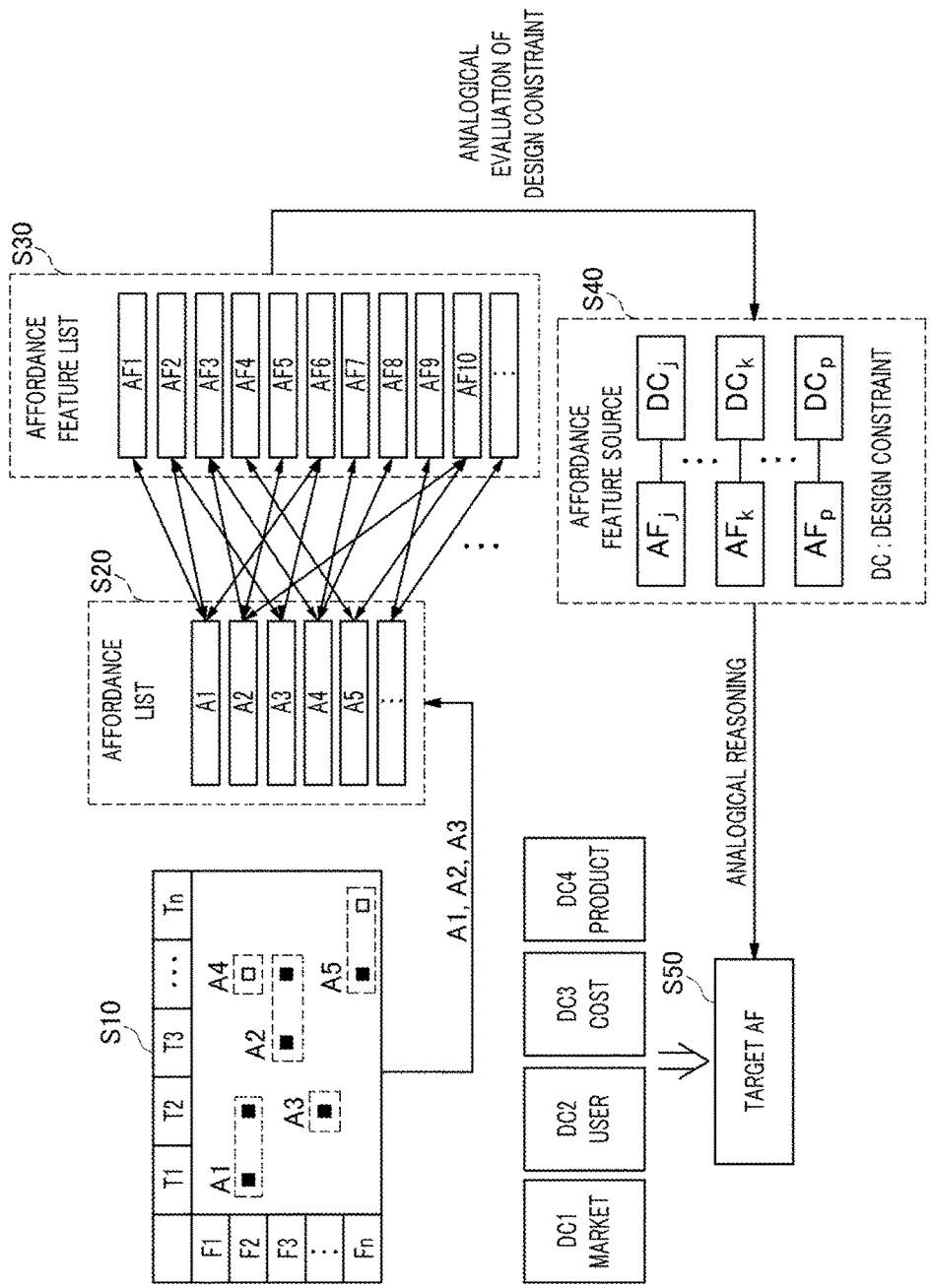
FIG. 8 is a diagram showing the entire framework for designing a product in the design system using an affordance feature repository.

FIG. 8 is a diagram showing the entire framework for designing a product in the design system 100 using an affordance feature repository.

The design system 100 using an affordance feature repository in accordance with the example embodiment may design a product through a series of processes according to the framework illustrated in FIG. 8.

The user identifies an affordance for a product to be designed on the basis of Function-Task Interaction (FTI) (S10). At this time, multiple affordances for a single product may be identified.

The user may update all or some of the multiple affordances in the affordance storage list (S20). At this time, the affordances stored in the affordance storage list may be correlated with multiple affordance features (530).

If the user wants to search an affordance feature through the search unit 110, multiple affordance features corresponding to an affordance are searched. In this case, design constraints of a product related to the affordance features are also searched (540).

Then, the user selects an affordance feature to be used at the time of designing the product from the searched multiple affordance features, and an image and a design constraint of the product corresponding to the selected affordance feature are output on the user interface (550).

At this time, the user may correct the design constraint of the product corresponding to the selected affordance feature for the predetermined design target on the basis of analogical reasoning with a product to be designed, and may reflect the corrected design constraint and design a product. Further, the selected affordance feature may be pre-stored in the storage unit 130 or may be newly derived by the analogical reasoning unit 150.

Information of the product designed as such, i.e., affordances and affordance features for the product and design information corresponding thereto, may be updated by the updating unit 140, and newly derived affordance features and design information corresponding thereto may also be accumulated and used at the time of designing a new product in the future.

Figure 9:
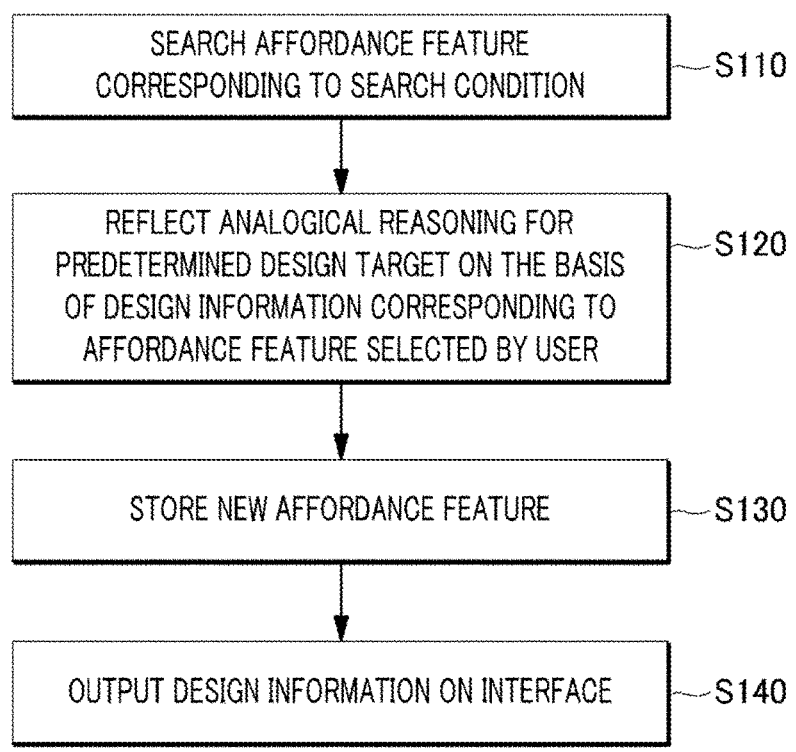
FIG. 9 is a diagram showing a design method using an affordance feature repository in accordance with an example embodiment.

FIG. 9 is a diagram showing a design method using an affordance feature repository in accordance with an example embodiment.

Affordance features corresponding to search conditions set by the user are searched (S110). A search target is a storage unit in which multiple affordances, one or more affordance features matched with each of the affordances, and design information corresponding to each of the affordance features are stored.

At this time, in the step of searching affordance features, the affordance features may be searched on the basis of images and structural descriptions of the affordance features. Further, in the step of searching affordance features, the affordance features may be searched by way of keyword search. The step of searching affordance features has been described with reference to FIG. 4 to FIG. 5, and, thus, detailed description thereof will be omitted.

The design system 100 using an affordance feature repository may perform analogical reasoning (S120) on the basis of design information corresponding to an affordance feature selected by the user from design information corresponding to the affordance features searched in the searching step (S110).

Thus, a new affordance feature for a predetermined design target to be designed by the user may be derived. The newly derived affordance feature may be stored together with or independently from the pre-stored information (S130).

Further, affordance features are searched according to search conditions set by the user, and a design constraint corresponding to an affordance feature selected by the user from the searched affordance features and a product designed by reflecting the design constraint may be updated in the system. Therefore, if the user wants to design a new product, the user can search the updated affordance feature. Thus, as the design system is continuously used, updated data are accumulated. Therefore, in the future, a group may be formed according to a project, a product, and a concept for each user and a history of the used affordance feature repository may be established.

Then, design information corresponding to the searched affordance features and design information corresponding to the affordance feature selected by the user may be output on the user interface (S140). Since the output affordance feature and design information corresponding thereto are output on the user interface, the user corrects only a part of the design information (for example, design constraint) of a product corresponding to the output affordance feature and thus reflect the corrected design information and easily make a design at the time of designing a product in the future.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A system for product design using affordance features, the system comprising:
   a non-transitory computer-readable medium configured to store multiple affordances, one or more affordance features matched with each of the affordances, design information corresponding to each of the affordance features and an application program for product design using the affordance features;
   one or more processors configured to execute the application program,
   wherein upon execution of the application, the one or more processors search affordance features corresponding to search conditions set by a user; output design information corresponding to the affordance features searched by the processor and design information corresponding to an affordance feature selected by the user on a user interface; and perform analogical reasoning on the basis of the design information corresponding to the selected affordance feature and derives a new affordance feature for a predetermined design target to be designed by the user,
   the affordance features are extracted on the basis of the affordances,
   the affordances are identified on the basis of correlations between multiple functions and activities for a pre-analyzed design target, and
   the design information comprises at least one of context-based activity model information and design constraint information corresponding to each of the affordance features.

2. The system of claim 1,
   wherein the one or more processors search the affordance features on the basis of the affordances, predetermined design target and images and structural descriptions of the affordance features.

3. The system of claim 1,
   wherein the one or more processors search the affordance features by way of keyword search.

4. The system of claim 1, further comprising:
   wherein the one or more processors are further configured to update the affordance feature selected by the user from the affordance features searched by the one or more processors.

5. The system of claim 1,
   wherein the non-transitory computer-readable medium is further configured to store a new affordance feature and design information corresponding to a new affordance feature.

6. The system of claim 1,
   wherein the affordance features are structural elements of artifacts which provide affordances to user.

7. A method of product design using affordance features, the method comprising:
   storing, in a non-transitory computer-readable medium, multiple affordances, one or more affordance features matched with each of the affordances, and design information corresponding to each of the affordance features;
   searching, by one or more processors, affordance features corresponding to search conditions set by a user;
   performing, by one or more processors, analogical reasoning on the basis of design information corresponding to an affordance feature selected by the user from design information corresponding to the searched affordance features; and
   deriving, by one or more processors, a new affordance feature for a predetermined design target to be designed by the user,
   wherein the affordance features are extracted on the basis of the affordances,
   the affordances are identified on the basis of correlations between multiple functions and activities for a pre-analyzed design target, and
   the design information comprises at least one of context-based activity model information and design constraint information corresponding to each of the affordance features.

8. The method of claim 7, further comprising:
   outputting the design information corresponding to the searched affordance features and the design information corresponding to the affordance feature selected by the user on a user interface.

9. The method of claim 7,
   wherein, in the step of the searching for affordance features corresponding to search conditions set by a user, the affordance features are searched on the basis of images and structural descriptions of the affordance features.

10. The method of claim 7,
    wherein, in the step of the searching for affordance features corresponding to search conditions set by a user, the affordance features are searched by way of keyword search.

11. The method of claim 7, further comprising:
    updating the affordance feature selected by the user from the searched affordance features.

12. The method of claim 7,
    wherein, in the step of the storing, the newly derived affordance feature is further stored.

13. The method of claim 7,
    wherein the affordance features are structural elements of artifacts which provide affordances to user.

* * * * *